US008212354B2

(12) United States Patent
Krishnamoorthy

(10) Patent No.: US 8,212,354 B2
(45) Date of Patent: Jul. 3, 2012

(54) ACTIVE PLASTIC BRIDGE CHIPS

(75) Inventor: Ashok V. Krishnamoorthy, San Diego, CA (US)

(73) Assignee: Oracle America, Inc., Redwood City, CA (US)

( * ) Notice: Subject to any disclaimer, the term of this patent is extended or adjusted under 35 U.S.C. 154(b) by 262 days.

(21) Appl. No.: 12/640,486

(22) Filed: Dec. 17, 2009

(65) Prior Publication Data

US 2011/0147907 A1 Jun. 23, 2011

(51) Int. Cl.
*H01L 23/34* (2006.01)
(52) U.S. Cl. .......................... 257/724; 257/723
(58) Field of Classification Search .................. 257/723, 257/724, 777, 685, 686
See application file for complete search history.

(56) References Cited

U.S. PATENT DOCUMENTS

| | | | |
|---|---|---|---|
| 7,208,826 B2 * | 4/2007 | Sakamoto et al. ............ 257/687 |
| 7,356,213 B1 | 4/2008 | Cunningham et al. | |
| 7,486,853 B2 | 2/2009 | Cunningham et al. | |
| 7,514,289 B2 | 4/2009 | Krishnamoorthy et al. | |
| 7,554,195 B2 | 6/2009 | Zingher et al. | |
| 7,574,077 B2 | 8/2009 | Zheng et al. | |
| 7,592,707 B2 | 9/2009 | Krishnamoorthy et al. | |
| 7,838,409 B2 * | 11/2010 | Zingher et al. ............... 438/599 |
| 8,026,597 B2 * | 9/2011 | Brandenburg et al. ....... 257/714 |
| 2006/0095639 A1 * | 5/2006 | Guenin et al. ................ 710/310 |
| 2007/0075442 A1 | 4/2007 | Krishnamoorthy et al. | |
| 2007/0075443 A1 | 4/2007 | Cunningham et al. | |
| 2007/0075444 A1 | 4/2007 | Zheng et al. | |
| 2007/0152344 A1 | 7/2007 | Zingher et al. | |
| 2007/0216036 A1 | 9/2007 | Krishnamoorthy et al. | |
| 2009/0067851 A1 | 3/2009 | Krishnamoorthy et al. | |
| 2009/0085183 A1 | 4/2009 | Mitchell et al. | |
| 2009/0085233 A1 | 4/2009 | Krishnamoorthy et al. | |
| 2009/0089466 A1 | 4/2009 | Cunningham et al. | |
| 2009/0179334 A1 | 7/2009 | Krishnamoorthy et al. | |
| 2009/0280601 A1 | 11/2009 | Krishnamoorthy et al. | |
| 2011/0223778 A1 * | 9/2011 | Chow et al. ..................... 439/66 |
| 2011/0227212 A1 * | 9/2011 | Cheng et al. .................. 257/724 |

OTHER PUBLICATIONS

Robert J. Drost et al., "Proximity Communication", IEEE Journal of Solid-State Circuits, vol. 39, No. 9, Sep. 2004, p. 1529-1535.
Alex Z. Kattamis et al., "High Mobility Nanocrystalline Silicon Transistors on Clear Plastic Substrates", IEEE Electron Device Letters, vol. 27, No. 1, Jan. 2006, p. 49-51.
K. Long et al., "Stability of Amorphous-Silicon TFTs Deposited on Clear Plastic Substrates at 250 C to 280 C", IEEE Electron Device Letters, vol. 27, No. 2, Feb. 2006, p. 111-113.
Sung Kyu Park et al., "Solution Processed OTFT Circuits on Plastic Substrates", IEEE, 2007, p. 23-24.

* cited by examiner

*Primary Examiner* — S. V Clark
(74) *Attorney, Agent, or Firm* — Brooks Kushman P.C.

(57) ABSTRACT

A system for proximity communication between semiconductor chips includes a package assembly. The package assembly includes a plurality of bridge circuits made of organic or plastic semiconductor material. A plurality of base chips are assembled to the package assembly. The package assembly positions and aligns the plurality of base chips such that the bridge circuits bridge the base chips and enable proximity communication between the base chips.

18 Claims, 4 Drawing Sheets

ACTIVE PLASTIC BRIDGE CHIPS

BACKGROUND OF THE INVENTION

1. Field of the Invention

The invention relates to the packaging of chips to enable proximity communication, and in particular, to the need for proper alignment (in x-, y-, and z-directions) in a thermally and mechanically challenging environment surrounding the chip.

2. Background Art

High performance computing (HPC) has entered into the multi-core CPU era. Although the computational bandwidth may scale linearly with the number of cores, the communication bandwidth between multiple cores on multiple chips is becoming a potential system bottleneck. Proximity Communication (PxC) holds the promise of revolutionizing HPC by solving its communication bottleneck. Proximity communication can be broadly defined as wireless electromagnetic communication between chips, and has been investigated by means of capacitive coupling, inductive coupling, and most recently, optical coupling between chips.

In capacitive coupling, typically, square or rectangular pads are used on both chips. Binary voltages are applied to the transmitter plate that in turn induce corresponding voltage changes in the receiving pad. One of the critical issues of proximity communication is a need for proper alignment (in x-, y-, and z-directions) in a thermally and mechanically challenging environment surrounding the chip.

FIG. 1 depicts the general concept for face-to-face integrated circuits communicating by capacitive or optical methods—proximity communication. In both cases, very high communication signal density can be achieved when compared to wire-bonding or solder-ball connections. In addition, to communicate off-chip, the circuits need drive only a high-impedance, capacitive pad (or optical modulator), very much akin to the gate of a transistor. This removes the need for high-to-low impedance converters that have traditionally prevented substantive reduction in the power dissipation of the off-chip driver circuits in spite of improvements in transistor efficiency.

As shown in FIG. 1, an array 10 of silicon chips 12, 14 is illustrated. The silicon chips 12, 14 are positioned face-to-face with overlapping areas 16 exchanging electromagnetic signals via capacitive or optical proximity communication. The triangular symbol 18 points to the active surface of the chip or wafer.

In the capacitive case, the electrical pad pitch may be on the order of 20 microns. Each pad can drive signals at line rates of 2.5-5 Gbps or higher. This provides a potential communication density in excess of 1.25 petabits/cm$^2$. Experimental capacitive proximity communication circuits have yielded aerial densities up to 43 terabits/cm$^2$ to date. In the optical case, an optical coupler can be as small as 20 microns on a side. The optical coupler may communicate many wavelength-multiplexed channels (for example, as few as four or as many as 64 may be envisaged with current technologies), with each channel operating at line rates of 10 Gbps and larger. The assumption of 16 channels at 10 Gbps per channel with an optical coupler pitch of 35 microns results in a potential communication density of 13 petabits/cm$^2$.

With continuing reference to FIG. 1, it is useful to connote the lower chips 14 in FIG. 1 as "island" chips, and the upper chips 12 as "bridge" chips. Hence, power and ground may be externally provided to the island chips 14, which may additionally have much greater functionality, processing power, and consequently power consumption. The bridge chips 12 may have correspondingly lower functionality and power consumption with their primary function being to connect two or more island chips 14 together. In this configuration, electrical power and cooling must separately be supplied to the exterior surface of each chip layer. The challenge is doing this in a manner which will provide the required alignment between chips. This challenge gets significantly greater as the power levels of the chips and the number of chips increase.

In addition to the lateral tolerance, there is a need to maintain the vertical "z-separation" between corresponding transmitter and receiver pads on opposing chips to a minimum. This is because the capacitively coupled signal voltage on a particular receiver pad is inversely proportional to the distance between the receiver pad and the transmitter pad located on the opposing chip. The maintenance of this precise z-alignment is difficult, particularly as the number of chips in the array grows large. An additional factor that makes this alignment difficult is that such an array may experience large temperature excursions and temperature gradients during operation. As described above, the island chips 14 and corresponding bridge chips 12 will require precision alignment not only laterally but also axially (in other words z-direction or height), to enable signals to be reliably transferred between chips using proximity communication.

It is typically the case that the vertical separation between facing chips must be maintained below a cut-off distance at which point the capacitive coupling between chips is insufficiently strong to support reliable communication channels between the chips. Hence, when the bridge chips 12 and island chips 14 are rigid (that is, non-compliant), the alignment of a large array of chips becomes challenging. This is especially true when taking into account the flatness tolerances of the heat-sink or the supporting base of the chip arrays in the package and packaging considerations associated with tiling chips in a remateable fashion.

Existing approaches for packaged multi-chip proximity communication must permit the use of juxtaposed semiconductor chips that both face down and face up in the same package—resulting in increased package complexity and cost.

Background information may be found in Robert J. Drost, Robert David Hopkins, Ron Ho, Ivan E. Sutherland, "Proximity Communication," IEEE Journal of Solid-State Circuits, vol. 39, no. 9, September 2004, pp. 1529-1535; Alex Z. Kattamis, Russell J. Holmes, I-Chun Cheng, Ke Long, James C. Sturm, Stephen R. Forrest, and Sigurd Wagner, "High Mobility Nanocrystalline Silicon Transistors on Clear Plastic Substrates," IEEE Electron Device Letters, vol. 27, no. 1, January 2006, pp. 49-51; K. Long, A. Z. Kattamis, I.-C. Cheng, H. Gleskova, S. Wagner, and J. C. Sturm, "Stability of Amorphous-Silicon TFTs Deposited on Clear Plastic Substrates at 250° C. to 280° C.," IEEE Electron Device Letters, vol. 27, no. 2, February 2006, pp. 111-113; Sung Kyu Park, Sankar Subramanian, John Anthony, and Thomas N. Jackson, "Solution processed OTFT circuits on plastic substrates," IEEE, 2007.

Further background information may be found in U.S. Pat. Nos. 7,592,707, 7,574,077, 7,554,195, 7,514,289, 7,486,853, and 7,356,213. Further background information may also be found in U.S. Pub. Nos. 2009/0280601, 2009/0179334, 2009/0089466, 2009/0085233, 2009/0085183, 2009/0067851, 2007/0216036, 2007/0152344, 2007/0075444, 2007/0075443, 2007/0075442, and 2006/0095639.

SUMMARY OF THE INVENTION

In one embodiment of the invention, a system for proximity communication between semiconductor chips comprises a package, a plurality of base chips assembled to the package, and a plurality of plastic bridge chips assembled to the package. The package and the plurality of plastic bridge chips cooperate to position and align the plurality of base chips and the plurality of plastic bridge chips. The plastic bridge chips bridge the base chips, and enable proximity communication between the base chips.

Additional features may be implemented individually or in combinations, depending on the application. For example, the package and the plastic bridge chips may be made of injection-molded plastic. The package may include a plurality of pressure clips arranged such that the plastic bridge chips bridge the base chips, and are held in place by the pressure clips. Further, one or more of the plastic bridge chips may comprise a plurality of metal vias such that a plastic bridge chip provides power and ground connections to an adjacent base chip.

The plurality of base chips may include a linear array of base chips, with the plurality of plastic bridge chips including at least one plastic bridge chip arranged to span across a base chip in the linear array. In an alternative, the plurality of base chips may include a linear array of base chips, with the plurality of plastic bridge chips including at least one plastic bridge chip arranged to bridge only a gap between adjacent base chips in the linear array of base chips, without spanning across a base chip.

In another embodiment of the invention, a system for proximity communication between semiconductor chips comprises a package, a plurality of base chips assembled to the package, and a plurality of plastic bridge pressure clips arranged to hold the base chips in place. Each plastic bridge pressure clip includes a bridge circuit. The package and the plurality of plastic bridge pressure clips cooperate to position and align the plurality of base chips and the plurality of plastic bridge pressure clips such that the bridge circuits bridge the base chips and enable proximity communication between the base chips.

Additional features may be implemented individually or in combinations, depending on the application. For example, the package and the plastic bridge pressure clips may be made of injection-molded plastic. Further, one or more of the plastic bridge pressure clips may comprise a plurality of metal vias such that the plastic bridge pressure clip provides power and ground connections to an adjacent base chip. The plurality of base chips may include a linear array of base chips, with the plurality of plastic bridge pressure clips including at least one plastic bridge pressure clip arranged to bridge only a gap between adjacent base chips in the linear array of base chips, without spanning across a base chip.

In another embodiment of the invention, a system for proximity communication between semiconductor chips comprises a package assembly including a plurality of bridge circuits made of organic semiconductor material, and a plurality of base chips assembled to the package assembly. The package assembly positions and aligns the plurality of base chips. The bridge circuits bridge the base chips and enable proximity communication between the base chips.

Additional features may be implemented individually or in combinations, depending on the application. For example, the package assembly may further comprise a plurality of plastic bridge chips. Each plastic bridge chip includes a bridge circuit, with the plastic bridge chips bridging the base chips. For example, the plurality of plastic bridge chips and the plurality of base chips may comprise a positive feature/depression arrangement for aligning the bridge chips with respect to the base chips. Further, for example, at least one of the plastic bridge chips may further include at least one additional special function circuit made of organic semiconductor material.

The package assembly may further comprise a plurality of pressure clips arranged such that the plastic bridge chips bridge the base chips and are held in place by the pressure clips. In an alternative, the package assembly may further comprise a plurality of plastic bridge pressure clips, with each plastic bridge pressure clip including a bridge circuit, and the plastic bridge pressure clips being arranged such that the bridge circuits bridge the base chips and the base chips are held in place by the pressure clips.

There are many advantages associated with embodiments of the invention. The package assembly may position and align the base chips in a generally planar arrangement, with at least one base chip directly connected to more than two bridge circuits. In another example, the plurality of base chips may include a linear and generally coplanar array of base chips.

DETAILED DESCRIPTION OF THE PREFERRED EMBODIMENTS

Figure 1:
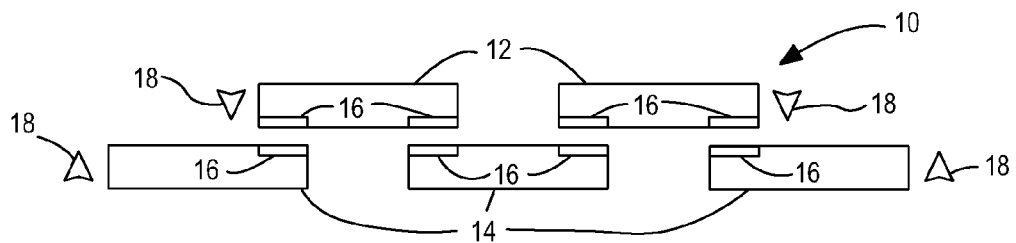
FIG. 1 depicts the general concept for face-to-face integrated circuits communicating by capacitive or optical methods—proximity communication.
Figure 2:
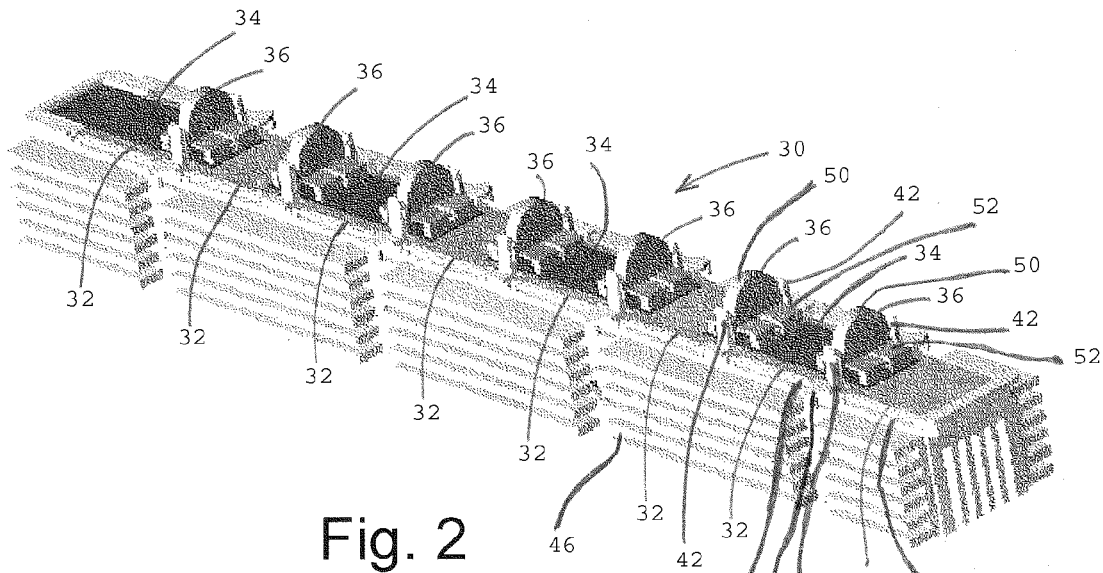
FIG. 2 illustrates a plastic injection-molded package showing a linear array of eight face-up silicon CMOS chips bridged by face down plastic bridge chips and held in place by pressure clips, in a first embodiment of the invention.

FIG. 2 illustrates a plastic injection-molded package 30 showing a linear array of eight face-up silicon CMOS base or island chips 32. A plurality of face-down plastic bridge chips 34 bridges the silicon base chips 32. The silicon base chips 32 and plastic bridge chips 34 are held in place by a plurality of pressure clips 36. As shown, each plastic bridge chip 34 spans across a silicon base chip 32 in the linear array.

In more detail, the package 30 is composed of injection-molded plastic body 40 having tabs 42 for receiving the pressure clips 36. Heat sink arrangements 46 are assembled to package body 40, and base chips 32 sit on chip receiving portions 44. Each pressure clip 36 includes a body portion 50 and a base portion 52. The base portion 52 and body portion 50 meet to form a pair of opposing steps for engaging opposing tabs 42 when a pressure clip 36 is snapped into place.

FIG. 2 depicts a first embodiment of the invention. Put another way, as shown in FIG. 2, the silicon base chips 32 and plastic bridge chips 34 are assembled to the package 30. The package 30 and the plurality of plastic bridge chips 34 cooperate to position and align the plurality of base chips 32 and the plurality of plastic bridge chips 34 such that the plastic bridge chips 34 bridge the base chips 32 and enable proximity communication between the base chips 32. It is appreciated that other variations are possible.

Figure 3:
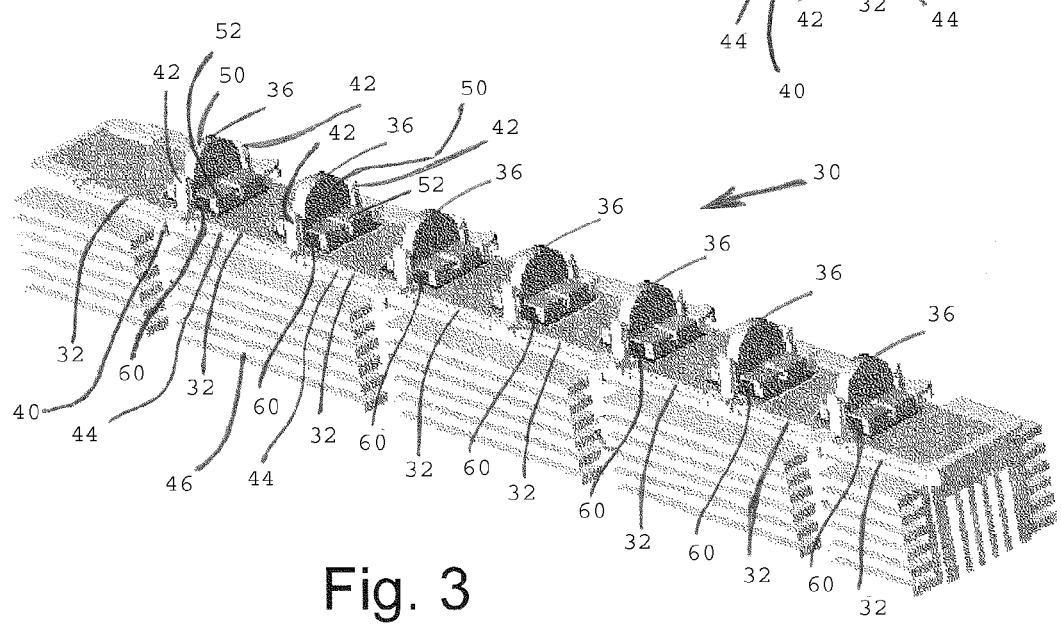
FIG. 3 illustrates a plastic injection-molded package showing a linear array of eight face-up silicon CMOS chips bridged by face down plastic bridge chips and held in place by pressure clips, in a second embodiment of the invention.

FIG. 3 illustrates a second embodiment of the invention where the plastic bridge chips do not span across the silicon base chips but twice as many smaller plastic bridge chips span only the gaps between the face-up silicon base chips, and are clipped into place. In more detail, a plastic injection-molded package 30 supports a linear array of eight face-up silicon CMOS base or island chips 32. A plurality of face-down plastic bridge chips 60 bridges the silicon base chips 32. The silicon base chips 32 and plastic bridge chips 60 are held in place by a plurality of pressure clips 36. As shown, each plastic bridge chip 60 bridges only a gap between adjacent base chips 32 in the linear array of base chips 32, without spanning across a base chip 32. Body portion 52 and base portion 50 of each pressure clip 36 meet to form a pair of opposing steps for engaging opposing tabs 42 when a pressure clip 36 is snapped into place, with each pressure clip 36 holding a single bridge chip 60. It is appreciated that other variations are possible.

Figure 4:
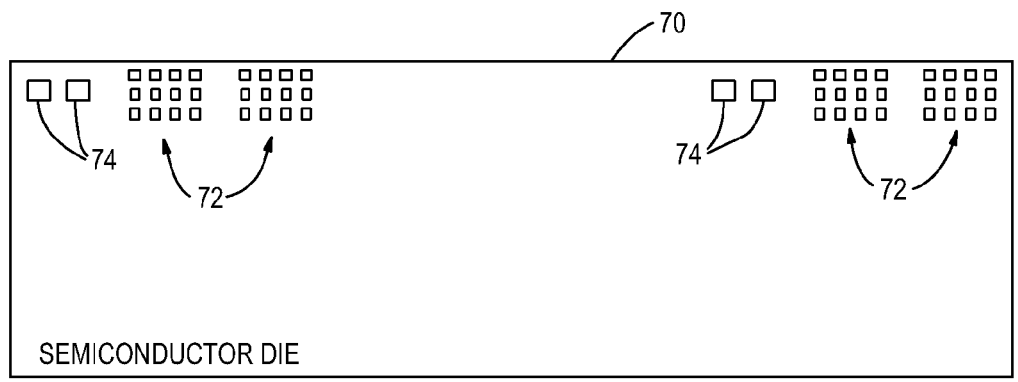
FIG. 4 illustrates a semiconductor die for a plastic bridge chip, showing metal vias that connect to the underlying island or base chips and showing proximity connectors.

FIG. 4 illustrates a semiconductor die 70 for a plastic bridge chip. Semiconductor die 70 includes proximity connectors 72, which may be capacitive or optical in embodiments of the invention. Semiconductor die 70 further includes metal vias 74 for connecting power and ground to the underlying island or base chips.

Figure 5:
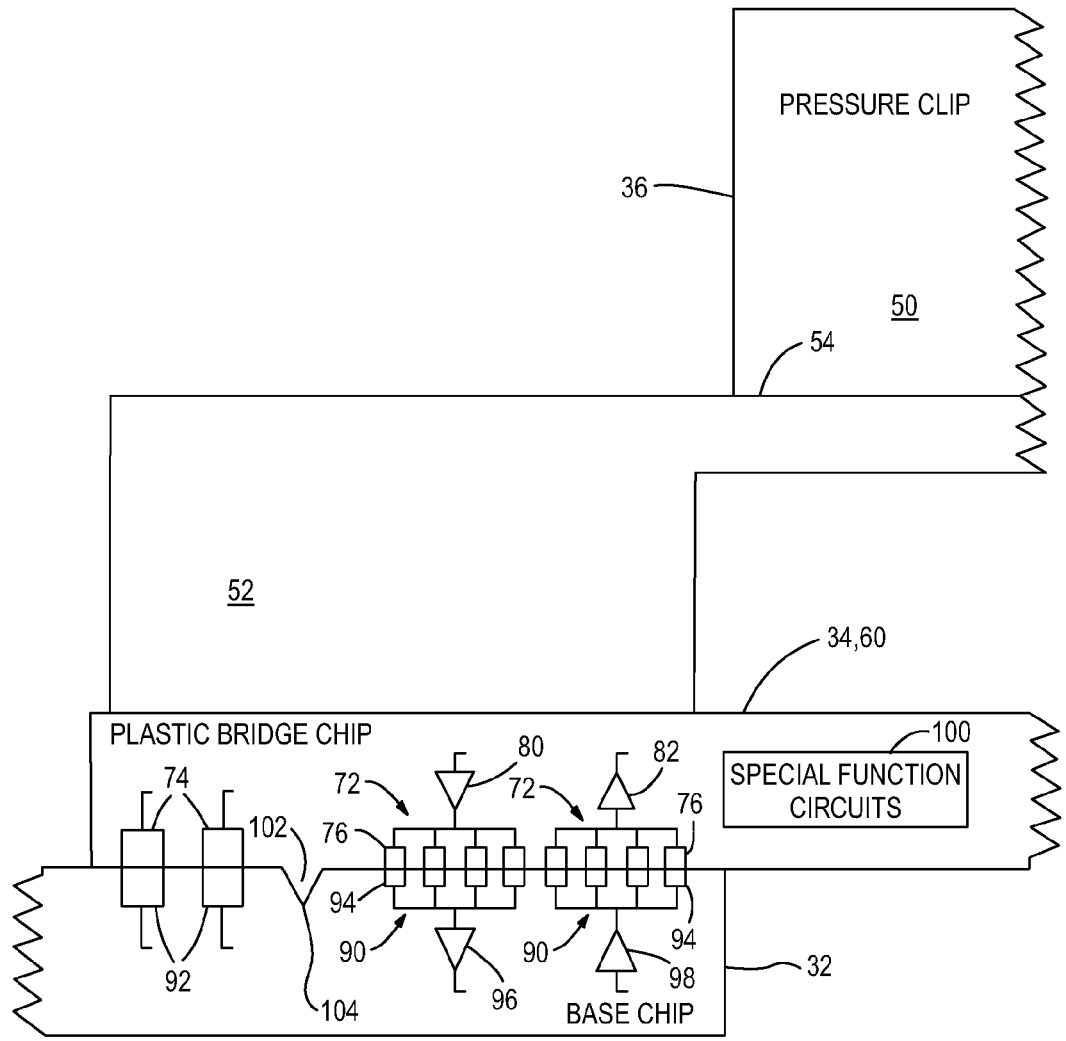
FIG. 5 illustrates an enlarged view of a base chip, a plastic bridge chip, and a pressure clip.

FIG. 5 illustrates an enlarged view of a base chip 32, a plastic bridge chip 34, 60, and a pressure clip 36. Face-up base chip 32 and face-down bridge chip 34, 60 are held in place by pressure clip 36. Pressure clip 36 includes body portion 50 and base portion 52, which meet to form a pair of opposing steps 54 for engaging the opposing tabs (not shown) when the pressure clip 36 is snapped into place. Proximity communication takes place between base chip 32 and plastic bridge chip 34, 60.

Plastic bridge chip 34, 60 includes proximity connectors 72, which may be capacitive or optical in embodiments of the invention. Plastic bridge chip 34, 60 further includes metal vias 74 for connecting power and ground to the underlying silicon island or base chip 32. In more detail, each proximity connector 72 includes a group of electrical pads or optical couplers 76. As shown buffer 80 buffers send signals, and buffer 82 buffers receive signals for plastic bridge chip 34, 60. The silicon base chip 32 includes proximity connectors 90. Corresponding metal vias 92 are provided for connecting to metal vias 74 on the plastic bridge chip 34, 60. Buffer 96 buffers receive signals, and buffer 98 buffers send signals for silicon base chip 32.

FIG. 5 also shows an example alignment mechanism for aligning plastic bridge chips 34, 60 with silicon base chips 32. In the example, plastic bridge chip 34, 60 includes a positive feature 102 and base chip 32 includes a depression 104 to form a positive feature/depression arrangement for aligning bridge chip 34, 60 with base chip 32. Also shown in FIG. 5, plastic bridge chip 34, 60 includes one or more additional special function circuits 100, in addition to the bridge circuitry.

Figure 6:
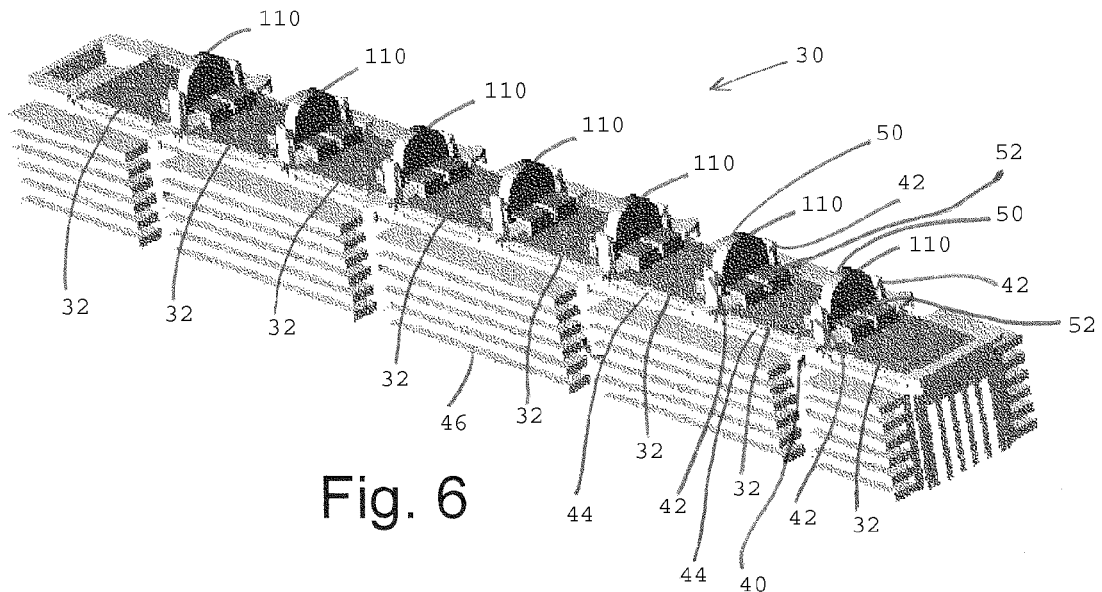
FIG. 6 illustrates a plastic injection-molded package showing a linear array of eight face-up silicon CMOS chips with plastic pressure clips which include both the mechanical positioning and the electrical bridge signaling functions, in a third embodiment of the invention.

FIG. 6 illustrates a third embodiment of the invention where plastic pressure clips 110 include both the mechanical positioning and the electrical (or optical) bridge signaling functions. A plastic injection-molded package 30 supports a linear array of eight face-up silicon CMOS base or island chips 32. The silicon base chips 32 are held in place by a plurality of plastic bridge pressure clips 110. Each plastic bridge pressure clip 110 includes a bridge circuit. As shown, each plastic bridge pressure clip 110 bridges only a gap between adjacent base chips 32 in the linear array of base chips 32, without spanning across a base chip 32. Body portion 52 and base portion 50 of each pressure clip 110 meet to form a pair of opposing steps for engaging opposing tabs 42 when a pressure clip 110 is snapped into place. It is appreciated that other variations are possible.

Figure 7:
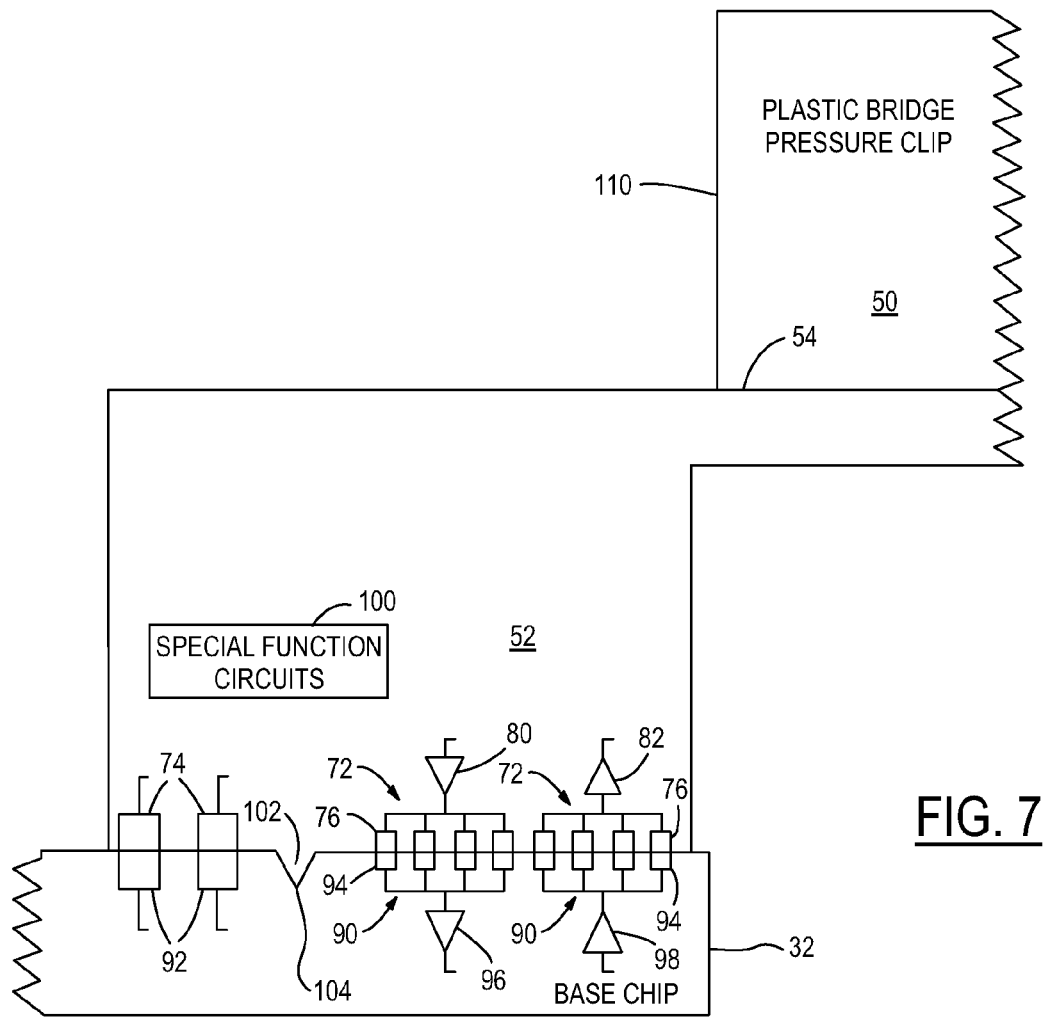
FIG. 7 illustrates an enlarged view of a base chip and a plastic pressure clip.

FIG. 7 illustrates an enlarged view of a base chip 32 and a plastic bridge pressure clip 110. Face-up base chip 32 is held in place by pressure clip 110. Pressure clip 110 includes body portion 50 and base portion 52, which meet to form a pair of opposing steps 54 for engaging the opposing tabs (not shown) when the pressure clip 110 is snapped into place. Proximity communication takes place between base chip 32 and plastic bridge pressure clip 110.

Plastic bridge pressure clip 110 includes proximity connectors 72, which may be capacitive or optical in embodiments of the invention. Plastic bridge pressure clip 110 further includes metal vias 74 for connecting power and ground to the underlying silicon island or base chip 32. In more detail, each proximity connector 72 includes a group of electrical pads or optical couplers 76. As shown buffer 80 buffers send signals, and buffer 82 buffers receive signals for plastic bridge pressure clip 110. The silicon base chip 32 includes proximity connectors 90. Corresponding metal vias 92 are provided for connecting to metal vias 74 on the plastic bridge pressure clip 110. Buffer 96 buffers receive signals, and buffer 98 buffers send signals for silicon base chip 32.

FIG. 7 also shows an example alignment mechanism for aligning pressure clip 110 with silicon base chip 32. In the example, pressure clip 110 includes a positive feature 102 and base chip 32 includes a depression 104 to form a positive feature/depression arrangement for aligning pressure clip 110 with base chip 32. Also shown in FIG. 7, pressure clip 110 includes one or more additional special function circuits 100, in addition to the bridge circuitry.

Figure 8:
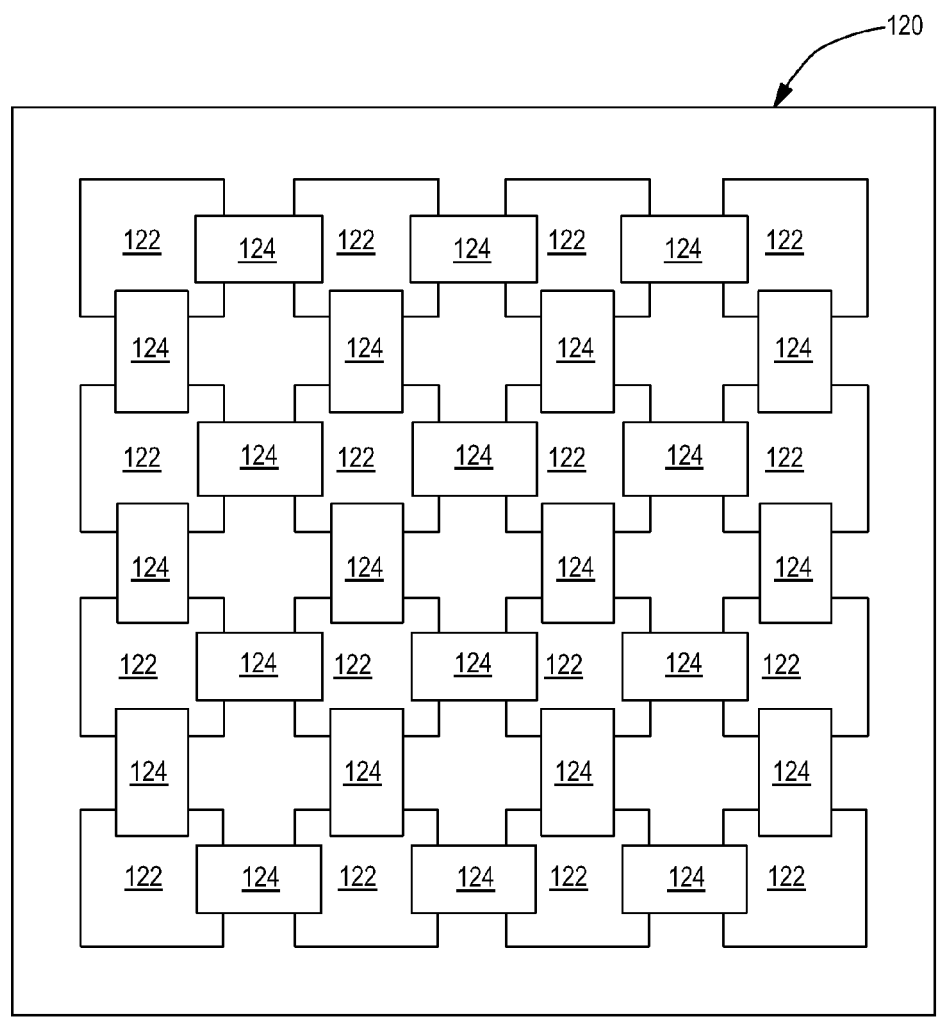
FIG. 8 illustrates a plastic injection-molded package showing a two-dimensional array of face-up silicon CMOS chips bridged by face down plastic bridge chips, in a fourth embodiment of the invention.

FIG. 8 illustrates a plastic injection-molded package 120 showing a two-dimensional array of face-up silicon CMOS chips 122 bridged by face down plastic bridge chips 124, in a fourth embodiment of the invention. That is, in accordance with the invention, two-dimensional extensions of the concept are possible, and the semiconductor island or base chips 122 and the plastic bridge chips 124 need not be all of a fixed, homogenous size, but may be of different sizes and aspect ratios. As shown in FIG. 8, a package 120 is illustrated with a plurality of base chips 122 assembled to the package 120. A plurality of plastic bridge chips 124 bridge the base chips 122. Each bridge chip 124 includes a bridge circuit. The base chips 122 are shown in a generally planar arrangement, with each base chip connected to two, three, or four bridge chips 124.

It is appreciated that the described embodiments are examples. Other implementations are possible. In general, the invention comprehends a package assembly including a plurality of bridge circuits made of organic or plastic semiconductor material. These bridge circuits may be implemented with, for example, active plastic bridge chips. In another example, the bridge circuits are implemented in plastic pressure clips which hold the base chips in place. In general, in accordance with the invention, a package assembly positions and aligns a plurality of base chips such that bridge circuits made of organic or plastic semiconductor bridge the base chips and enable proximity communication between base chips.

There are many advantages associated with embodiments of the invention. In general, embodiments of the invention utilize transistors in plastic or polymer semiconductor materials. Techniques to make transistors in plastic or polymer semiconductor materials are apparent to those of ordinary skill in the art. In one embodiment, a plastic package for proximity communication essentially combines an active bridge chip containing proximity communication circuits with the package providing approximate in-plane alignment between the bridge chips and the island or base chips. The plastic bridge chip makes possible signaling using proximity communication between the silicon semiconductor chips in a single, co-planar array. The primary function of the plastic bridge chips is signaling and, hence, they can be operated at low levels of dissipated power and can further simplify the power delivery and heat extraction from the proximity communication module.

In one aspect of the invention, the bridge and package may be combined into a single plastic or polymer entity providing both the bridge electronic proximity communication functionality and also semiconductor chip positioning functionality with approximate control of in-plane alignment (that is, on the order of 30 micron variation or less).

In another aspect of the invention, face-up (or face-down) only semiconductor chips and corresponding proximity communication circuits may be implemented in the plastic package, so as to permit proximity communication via electromagnetic waves between the corresponding circuits.

In an example embodiment, the bridge chips are integrated into a plastic housing that also provides mechanical stability for the silicon chips. The plastic housing may provide alignment features or lattice that support coarse alignment of the chips. This coarse alignment may maneuver the chips into approximate position with some play that allows a fine-alignment mechanism to snap-align the chips into place and determine the final, precise resting position of the chips.

The plastic bridge chips may have depressions or pits in them that allow the use of a ball-in-pit mechanism to engage the bridge and align it to a facing silicon chip. In another version, the plastic bridge has positive features designed into it that protrude from the surface of the chip and engage a facing silicon chip. In still another version, a predetermined amount of compliance or flexibility is built into the plastic bridge chip. One aspect of the invention allows the plastic bridge chip to accommodate silicon island chips that are not completely planar silicon and provide the necessary compliance required to maintain the chips within the desired target separation.

In yet another version, the plastic bridge chip is permanently attached to a first island chip on one of its sides and bridges to a second island chip to which it is not attached. In an alternate version, the plastic bridge has multiple wings (for example, two, three, or four wings) that allow compliant overlap with neighboring chips along one or two dimensions. In another alternate version, the plastic bridge has metal vias that can be used to provide power and ground to the underlying semiconductor chip.

One aspect of the invention relates to minimizing z-separation between the plastic bridge and a corresponding island by the use of a pressure spring, silicone gel, or other packaging materials that can exert longitudinal force when compressed. Certain other special purpose functions (beyond signal relay/communication) can also be built into the plastic transistor bridges, depending on the level of integration possible. Such special purpose functions may include processing, memory, or sensors that measure the state of the package including the alignment, temperature, stress/strain, etc. Still further, the use of a single-layer of substantially co-planar silicon chips provides significant benefits from the viewpoint of the module design, whose function it is to provide the required alignment between chips for proximity communications, power delivery, and heat extraction.

It is appreciated that a variety of forms are possible for the invention. The illustrated embodiments use separate clips to press down on the bridges. This type of arrangement is convenient in the illustrated embodiments because the number of chips is small and because the chips are lined up in a row. One or both of these reasons may not actually hold true in general for a two-dimensional array. It is appreciated that other embodiments of the invention may have one or a few clips that may push down simultaneously on many chips in the array. That is, multiple or a single long chip spanning multiple chips is a possibility.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A system for proximity communication between semiconductor chips, the system comprising:
   a package;
   a plurality of base chips assembled to the package; and
   a plurality of plastic bridge chips assembled to the package;
   wherein the package and the plurality of plastic bridge chips cooperate to position and align the plurality of base chips and the plurality of plastic bridge chips such that the plastic bridge chips engage the base chips to enable proximity communication between the base chips in the form of at least one of (i) capacitive coupling and (ii) optical coupling.

2. The system of claim 1 wherein the package is made of injection-molded plastic.

3. The system of claim 2 wherein the plastic bridge chips are made of injection-molded plastic.

4. The system of claim 1 wherein the package comprises:
   at least one pressure clip arranged such that the plastic bridge chips bridge the base chips and are held in place by the at least one pressure clip.

5. The system of claim 1 wherein at least one of the plastic bridge chips comprises:
   a plurality of metal vias such that the plastic bridge chip provides power and ground connections to an adjacent base chip.

6. The system of claim 1 wherein the plurality of base chips includes a linear array of base chips, and the plurality of plastic bridge chips includes at least one plastic bridge chip arranged to span across a base chip in the linear array.

7. The system of claim 1 wherein the plurality of base chips includes a linear array of base chips, and the plurality of plastic bridge chips includes at least one plastic bridge chip arranged to bridge only a gap between adjacent base chips in the linear array of base chips, without spanning across a base chip.

8. A system for proximity communication between semiconductor chips, the system comprising:
   a package;
   a plurality of base chips assembled to the package; and a plurality of plastic bridge pressure clips arranged to hold the base chips in place, each plastic bridge pressure clip including a bridge circuit;

wherein the package and the plurality of plastic bridge pressure clips cooperate to position and align the plurality of base chips and the plurality of plastic bridge pressure clips such that the bridge circuits bridge the base chips and enable proximity communication between the base chips.

9. The system of claim 8 wherein the package is made of injection-molded plastic.

10. The system of claim 9 wherein the plastic bridge pressure clips are made of injection-molded plastic.

11. The system of claim 8 wherein at least one of the plastic bridge pressure clips comprises:

a plurality of metal vias such that the plastic bridge pressure clip provides power and ground connections to an adjacent base chip.

12. The system of claim 8 wherein the plurality of base chips includes a linear array of base chips, and the plurality of plastic bridge pressure clips includes at least one plastic bridge pressure clip arranged to bridge only a gap between adjacent base chips in the linear array of base chips, without spanning across a base chip.

13. A system for proximity communication between semiconductor chips, the system comprising:

a package assembly including a plurality of bridge circuits made of organic semiconductor material; and a plurality of base chips assembled to the package assembly;

wherein the package assembly positions and aligns the plurality of base chips such that the bridge circuits bridge the base chips and enable proximity communication between the base chips;

wherein the package assembly further comprises:

a plurality of plastic bridge chips, each plastic bridge chip including a bridge circuit, the plastic bridge chips bridging the base chips;

at least one pressure clip arranged such that the plastic bridge chips bridge the base chips and are held in place by the at least one pressure clip.

14. The system of claim 13 wherein the plurality of plastic bridge chips and the plurality of base chips comprise a positive feature/depression arrangement for aligning the bridge chips with respect to the base chips.

15. The system of claim 13 wherein at least one of the plastic bridge chips further includes at least one additional special function circuit made of organic semiconductor material.

16. The system of claim 13 wherein the package assembly further comprises:

at least one plastic bridge pressure clip, each plastic bridge pressure clip including a bridge circuit, the plastic bridge pressure clips being arranged such that the bridge circuits bridge the base chips and the base chips are held in place by the pressure clips.

17. The system of claim 13 wherein the package assembly positions and aligns the base chips in a generally planar arrangement, and wherein at least one base chip is directly connected to more than two bridge circuits.

18. The system of claim 13 wherein the plurality of base chips includes a linear and generally coplanar array of base chips.

* * * * *